US010833507B2

(12) United States Patent
Manson

(10) Patent No.: US 10,833,507 B2
(45) Date of Patent: Nov. 10, 2020

(54) ISLAND DETECTION AND CONTROL OF A MICROGRID

(71) Applicant: Schweitzer Engineering Laboratories, Inc., Pullman, WA (US)

(72) Inventor: Scott M. Manson, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 365 days.

(21) Appl. No.: 15/826,350

(22) Filed: Nov. 29, 2017

(65) Prior Publication Data

US 2018/0152022 A1    May 31, 2018

Related U.S. Application Data

(60) Provisional application No. 62/427,361, filed on Nov. 29, 2016.

(51) Int. Cl.
*H02J 3/38* (2006.01)
*H02J 3/14* (2006.01)
(Continued)

(52) U.S. Cl.
CPC ............. *H02J 3/381* (2013.01); *G01R 31/50* (2020.01); *H02J 3/14* (2013.01); *H02J 9/02* (2013.01);
(Continued)

(58) Field of Classification Search
CPC ...... H02J 3/381; H02J 9/02; H02J 3/14; H02J 3/388; G01R 31/50; G01R 19/2513; Y02B 10/72
See application file for complete search history.

(56) References Cited

U.S. PATENT DOCUMENTS

| 3,849,637 A | 11/1974 | Caruso |
| 4,916,328 A | 4/1990 | Culp |

(Continued)

FOREIGN PATENT DOCUMENTS

| CN | 101545953 | 1/2011 |
| DE | 10200733 | 7/2003 |
| EP | 1381132 | 9/2010 |

OTHER PUBLICATIONS

PCT/US2015/014486 Patent Cooperation Treaty, International Search Report and Written Opinion of the International Searching Authority, dated May 14, 2015.

(Continued)

*Primary Examiner* — Jared Fureman
*Assistant Examiner* — Emmanuel Dominique
(74) *Attorney, Agent, or Firm* — Jared L. Cherry; Richard M. Edge

(57) ABSTRACT

This disclosure pertains to control systems used in electric power systems. In one embodiment, a plurality of intelligent electronic devices (IEDs) is configured to monitor a respective portion of an electric power system. Each IED may obtain electric power system measurements from the respective portion of the electric power system, determine electric power system operating conditions from the electric power system measurements, and transmit the electric power system operating conditions. A master controller may communicate with the plurality of IEDs. The master controller may comprise a communications interface configured to receive the electric power system operating conditions from the plurality of IEDs, a topology detection subsystem configured to determine a topology of the electric power system based on a common event detected by the plurality of IEDs, and an action subsystem configured to implement a control (Continued)

action or a protective action based on the topology of the electric power system.

21 Claims, 5 Drawing Sheets

(51) Int. Cl.
  *H02J 9/02* (2006.01)
  *G01R 31/50* (2020.01)
  *G01R 19/25* (2006.01)
(52) U.S. Cl.
  CPC .......... *G01R 19/2513* (2013.01); *H02J 3/388* (2020.01); *Y02B 10/70* (2013.01)

(56) References Cited

U.S. PATENT DOCUMENTS

| | | | |
|---|---|---|---|
| 5,436,510 A | 7/1995 | Gilbert | |
| 5,734,586 A | 3/1998 | Chiang | |
| 6,204,642 B1 | 3/2001 | Lawson | |
| 6,492,801 B1 | 12/2002 | Sims | |
| 6,608,635 B1 | 8/2003 | Mumm | |
| 7,138,728 B2 | 11/2006 | LeRow | |
| 7,698,233 B1 | 4/2010 | Edwards | |
| 8,131,383 B2 | 3/2012 | Pearson | |
| 8,604,803 B2 | 12/2013 | Dooley | |
| 8,606,372 B1 | 12/2013 | Harris | |
| 8,965,592 B2 | 2/2015 | Manson | |
| 9,008,850 B2 | 4/2015 | Manson | |
| 9,519,301 B2 | 12/2016 | Bartlett | |
| 10,333,301 B2* | 6/2019 | Gubba Ravikumar | H02J 13/0004 |
| 2002/0091503 A1 | 7/2002 | Carrillo | |
| 2003/0042876 A1 | 3/2003 | Ikeda | |
| 2004/0164717 A1 | 8/2004 | Thompson | |
| 2005/0285574 A1 | 12/2005 | Huff | |
| 2007/0008968 A1 | 1/2007 | Baker | |
| 2007/0162189 A1 | 7/2007 | Huff | |
| 2007/0168088 A1 | 7/2007 | Ewing | |
| 2007/0219755 A1 | 9/2007 | Williams | |
| 2007/0239372 A1 | 10/2007 | Schweitzer | |
| 2007/0239373 A1 | 10/2007 | Nasle | |
| 2008/0074810 A1 | 3/2008 | Guzman-Casillas | |
| 2009/0085407 A1 | 4/2009 | Venkatasubramanian | |
| 2009/0216386 A1* | 8/2009 | Wedel | H02J 3/14 700/295 |
| 2010/0312414 A1 | 12/2010 | Kumar | |
| 2011/0004425 A1 | 1/2011 | Schweitzer | |
| 2011/0012422 A1 | 1/2011 | Neher | |
| 2011/0022245 A1 | 1/2011 | Goodrum | |
| 2011/0035065 A1* | 2/2011 | Schweitzer, III | H02J 13/00034 700/286 |
| 2011/0054709 A1 | 3/2011 | Son | |
| 2011/0115301 A1* | 5/2011 | Bhavaraju | H02J 3/38 307/86 |
| 2011/0320058 A1 | 12/2011 | Rietmann | |
| 2012/0123602 A1 | 5/2012 | Sun | |
| 2012/0226386 A1* | 9/2012 | Kulathu | H02J 13/0079 700/295 |
| 2012/0232710 A1 | 9/2012 | Warner | |
| 2012/0239216 A1* | 9/2012 | Kulathu | H02J 13/0006 700/295 |
| 2012/0310434 A1 | 12/2012 | Taft | |
| 2012/0310559 A1 | 12/2012 | Taft | |
| 2013/0018521 A1* | 1/2013 | Manson | H02J 13/0004 700/297 |
| 2013/0035800 A1* | 2/2013 | Kulathu | H02J 13/00034 700/295 |
| 2013/0035885 A1 | 2/2013 | Sharon | |
| 2013/0073100 A1* | 3/2013 | Seeley | G01R 19/2513 700/290 |
| 2013/0074513 A1 | 3/2013 | Mueller | |
| 2013/0116843 A1 | 5/2013 | Kim | |
| 2013/0166085 A1 | 6/2013 | Cherian | |
| 2013/0265680 A1* | 10/2013 | Smit | H02H 7/261 361/64 |
| 2014/0001847 A1 | 1/2014 | Khandelwal | |
| 2014/0293494 A1* | 10/2014 | Allen | H02J 13/0004 361/93.1 |
| 2015/0222123 A1 | 8/2015 | Manson | |
| 2015/0241894 A1 | 8/2015 | Bartlett | |
| 2015/0244170 A1 | 8/2015 | Bartlett | |
| 2015/0244171 A1 | 8/2015 | Bartlett | |
| 2015/0295529 A1 | 10/2015 | Rose | |
| 2015/0318705 A1* | 11/2015 | Lucas | H02J 3/381 307/129 |
| 2017/0271882 A1* | 9/2017 | Ravikumar | H02J 3/42 |
| 2018/0316188 A1* | 11/2018 | Ishchenko | H02J 3/06 |
| 2019/0052083 A1* | 2/2019 | Lucas, Jr. | H02J 3/18 |

OTHER PUBLICATIONS

PCT/US2015/014487 Patent Cooperation Treaty, International Search Report and Written Opinion of the International Searching Authority, dated May 14, 2015.

PCT/US2015/014488 Patent Cooperation Treaty, International Search Report and Written Opinion of the International Searching Authority, dated May 14, 2015.

Kai Sun, Da-Zhong Zheng and Qiang Lu, "Splitting Strategies for Islanding Operation of Large-Scale Power Systems Using OBDD-based methods," in IEEE Transactions on Power Systems, vol. 18, No. 2, pp. 912-923, May 2003.

Mark Grant, "Foxboro SCADA Systems Load Shedding and Electrical Monitoring Control Systems Design in Industrial Process Plants", 2012, retrieved on May 5, 2016 from http://iom.invensys.com/EN/pdfLibrary/WhitePaper_LoadSheddingandElectricalMonitoring.pdf.

* cited by examiner

ISLAND DETECTION AND CONTROL OF A MICROGRID

RELATED APPLICATIONS

This application claims priority under 35 U.S.C. § 119 to U.S. Provisional Patent Application No. 62/427,361 filed on Nov. 29, 2016, titled "Island Detection and Control of a Microgrid," which application is hereby incorporated by reference in its entirety.

TECHNICAL FIELD

This disclosure relates to systems and methods for control of microgrid electric power systems. More specifically, but not exclusively, this disclosure relates to the detection of island conditions in a microgrid, and control of the microgrid.

BRIEF DESCRIPTION OF THE DRAWINGS

Non-limiting and non-exhaustive embodiments of the disclosure are described, including various embodiments of the disclosure with reference to the figures included in the detailed description.

DETAILED DESCRIPTION

Figure 1:
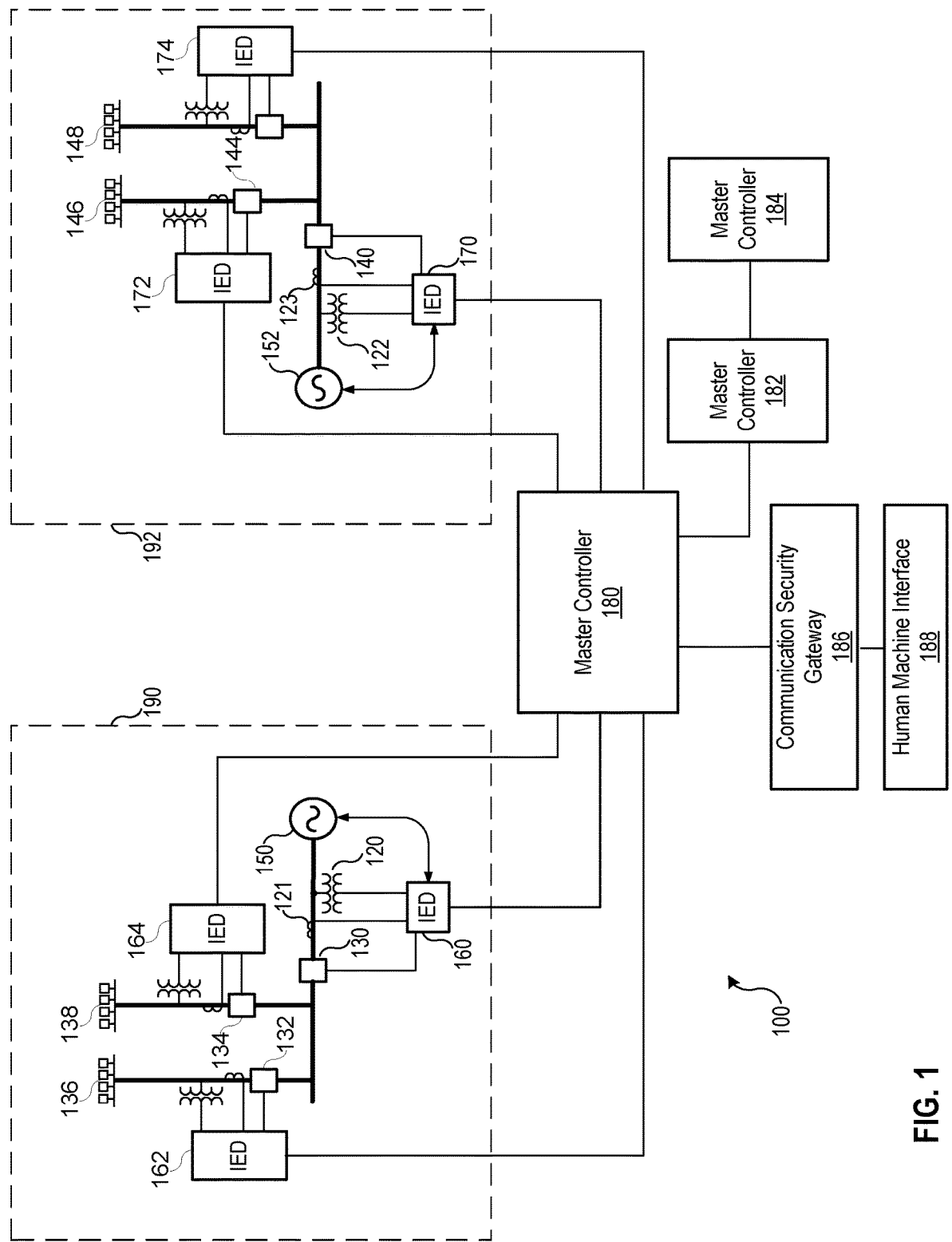
FIG. 1 illustrates a simplified one-line diagram of an electric power generation system including a generator and load control systems consistent with the embodiments of the present disclosure.

Electrical power generators and loads in an electrical power generation and distribution system may operate in conjunction with protection systems designed to maintain system stability, to prevent damage to the electrical power generators that may be caused by certain conditions, and to ensure safe operation of the system. To achieve these and other objectives, systems and methods consistent with the present disclosure may be configured to track the topology of a system and to identify electrical islands.

Various different protective devices may be used to detect different electrical power system conditions at different locations in the electric power system, and notify a central controller of such electric power system conditions. Such systems may require extensive set-up of the various protective devices, the communication system, and the central controller.

According to several embodiments herein described, local protective devices may provide simplified configuration, while permitting a system to provide local protection functions and facilitating communications with the central controller. A variety of technologies may be utilized to enable communications among devices consistent with the present disclosure. In various embodiments, devices may be configured for interchangeable use (e.g., a device may be able to perform a variety of functions) in order to simplify the set-up of the protection system.

In various embodiments, systems and methods consistent with the present disclosure may determine whether electrical sources (e.g., generators, photovoltaics, wind turbines, batteries, etc.) and electrical loads are electrically connected. Certain embodiments disclosed herein may be used in connection with systems capable of functioning as "islanded systems." As the term is utilized herein, an islanded system comprises any system in which electric power sources continue to provide electrical power in the absence of a connection to an electrical utility grid. For example, an islanded system may include a utility connected system that includes a distributed electrical source, a backup generator, or the like. Many types of facilities may utilize backup electrical systems (e.g., military applications, hospitals, oil refineries, gas separation plants, data centers, and the like), and may operate as an islanded system when electrical power from an electrical utility grid is unavailable. Other systems may generate their own power under typical conditions (e.g., forward military deployments, an offshore drilling ship, exploration ships, cruise ships, military ships, and remote facilities that are not connected to an electrical utility grid). Finally, the systems and methods disclosed herein may be used in the protection of electrical generators and loads connected to electrical delivery systems (e.g., a utility grid). For example, a protection system may be used at a generation site (e.g., a fossil-fuel generation site, a hydroelectric site, a wind farm, and the like).

Islanded electrical power generation and delivery systems may also be referred to as a microgrid. Microgrid systems may not have the advantage of being able to receive power from an electric utility grid, and accordingly, microgrid systems may be designed with redundancies in order to maximize the availability of electrical power. A microgrid system may, for example, include multiple electrical sources. Further, the microgrid system may be configured such that if an electrical source is taken off-line, either for maintenance or because of a problem, the microgrid system may continue to operate, although perhaps with reduced capabilities. Various embodiments disclosed herein may provide protection and monitoring of a plurality of electrical power generators, and further, may be configured to implement control actions in order to configure an electric power generation and delivery system.

In some embodiments, systems and methods consistent with the present disclosure may identify an islanded condition by injection of a transient disturbance into one electrical generator that may result in a frequency excursion. The frequency excursion associated with the injected disturbance may be exhibited on nodes of the electrical power systems in electrical communication with the generator. Local protective devices that detect the frequency excursion may report the temporary frequency excursion to the master controller. Using such information, a master controller may detect and track the topology of the electrical network and/or may determine an islanded condition.

Several aspects of the embodiments described may be implemented as software modules or components. As used herein, a software module or component may include any type of computer instruction or computer executable code located within a memory device and/or transmitted as electronic signals over a system bus, a wired network, or a wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor-executable instructions.

Electrical power generation and delivery systems are designed to generate, transmit, and distribute electrical energy to loads. Certain electrical power delivery systems are not connected to the central power grid for a variety of reasons, such as a remote location or a need for the electrical power generators to be mobile.

Electrical power generation and delivery systems may include a variety of equipment, such as electrical generators, electrical motors, power transformers, power transmission and distribution lines, circuit breakers, switches, buses, transmission and/or feeder lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, real-time automation controllers, bay controllers, meters, recloser controls, communication processors, computing platforms, programmable logic controllers (PLCs), programmable automation controllers, input and output modules, governors, exciters, statcom controllers, static VAR compensators (SVCs), on-load tap-changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

In several embodiments herein, IEDs may be coordinated in the monitoring and protection functions applied to electric power delivery systems. For example, the IEDs may be coordinated to operate to remove electric power from the smallest practical portion of the electric power system while removing the fault from the electric power delivery system. IEDs may be coordinated to operate to maintain voltage and/or frequency within acceptable levels on the electric power delivery system by operating voltage regulators, capacitor banks, reactors, and the like at various locations on the electric power delivery system. Furthermore, IEDs may be coordinated to determine event locations on the electric power delivery system.

FIG. 1 illustrates a simplified one-line diagram of an electric power system 100 in accordance with embodiments of the present disclosure. The electric power system 100 may include a plurality of electrical sources and loads, which may be electrically interconnected (although such interconnection is not separately illustrated in FIG. 1 for simplicity). Electric power system 100 includes a first generator 150 supplying electric power to loads 136 and 138. The generator 150 may be monitored using IED 160, which obtains electric power system measurements from the generator 150 using potential transformer ("PT") 120 and current transformer ("CT") 121. In other embodiments, other sensors may be used to monitor other electrical or physical parameters associated with generator 150. IED 160 may be configured to monitor generator 150 using measurements obtained from PT 120 and/or CT 121. IED 160 may be further configured to identify anomalous operating conditions. In response to such conditions, IED 160 may open circuit breaker 130 to disconnect generator 150 from the the remainder of electric power system 100.

IED 160 may be in communication with a master controller 180. IED 160 may be configured to communicate electric power system measurements, electric power system operating conditions calculated from the measurements, and/or generator operating conditions calculated from the measurements to master controller 180. IED 160 may further be configured to receive commands from master controller 180, and to implement such commands. For example, IED 160 may be configured to open circuit breaker 130 upon receipt of such command from master controller 180. IED 160 may further be configured to inject a disturbance into generator 150 upon command to do so by master controller 180.

As described in more detail below, the injected disturbance may be configured to introduce a transient frequency deviation into the electric power delivery system 100 by generator 150. Each node in system 100 that detects the transient frequency deviation may be deemed to be in electrical communication with generator 150 by master controller 180. In addition to transient frequency deviations introduced by using generator 150, a variety of actions may be used to detect electrical connection between nodes. For example, connection or disconnection of loads may cause decreases or increases in the voltage and/or frequency of the system 100. Nodes in system 100 that experience similar changes may also be deemed to be in electrical communication.

IED 162 may be configured to monitor electric power conditions related to power delivered to load 136. IED 162 may obtain electric power system measurements using PTs and/or CTs in electrical communication with a feeder configured to provide power to load 136. IED 162 may be in communication with master controller 180 and configured to send electric power system measurements and/or electric power system operating conditions to master controller 180. IED 162 may be further configured to determine whether the electrical or operating conditions are outside of predetermined operating parameters, and take a control action. For example, the IED 162 may determine that the operating conditions are outside of predetermined operating parameters and cause circuit breaker 132 to open, thus disconnecting load 136 from the remainder of system 100.

In certain embodiments, the circuit breaker 132 may comprise a Molded Case Circuit Breaker ("MCCB") configured with a trip mechanism that is capable of external triggering. MCCBs may be configured to detect overcurrent conditions and to open during an overcurrent condition. Such a circuit breaker may be independently operable to detect and trip for an overcurrent condition, and further operable in conjunction with IED 162 to open upon command from the IED 162. Other circuit breakers may be used in certain other embodiments disclosed herein.

IED 162 may further be configured to receive communications from master controller 180, and execute commands given thereby. For example, master controller 180 may command IED 162 to open circuit breaker 132. Upon receipt of such signal from the master controller 180, IED 162 may command circuit breaker 132 to open. In addition, IED 162 may be configured to communicate actions to master controller 180. For example, IED 162 may communicate to master controller 180 the opening or closing of circuit breaker 132. In some embodiments, the time of the event may be communicated, and master controller 180 may analyze information from other electrical nodes to determine whether such actions are reflected in the conditions detected by the other nodes.

IED 162 may further be configured to receive load shedding priority information. In some embodiments, load shedding priority information may be provided to IED 162 using, for example, a user interface on IED 162. In other embodiments, load shedding may be performed based on frequency. Basing load shedding decisions on frequency may simplify the control decisions to be implemented. The user interface of IED 162 may include push-buttons, LEDs, a touch-screen display, jumpers, a remote interface, a human-machine interface ("HMI"), or the like.

IED 164 may be configured similarly to IED 162, in that IED 164 may be configured to monitor electric power delivered to load 138 and operate circuit breaker 134. IED 164 may also be in communication with master controller 180 to transmit electric power system measurements and/or electric power system conditions thereto, and receive communications therefrom.

Generator 150, loads 136 and 138, CTs, PTs, circuit breakers 130, 132, 134, and IEDs 160, 162, and 164 may comprise a first islandable microgrid 190 of the electric power system 100. In various embodiments, an islandable microgrid may include more or fewer components than those illustrated. For example, an islandable microgrid may include several power generation devices, which may be generally referred to as a distributed energy resource (DER). Each DER may be monitored by a one or more IEDs that are in communication with the master controller. In various embodiments, a system may include more or fewer loads, more or fewer DERs, and/or more or fewer IEDs monitoring portions of the microgrid and in communication with the master controller.

System 100 further includes a second islandable microgrid 192 that is similar to the first islandable microgrid 190. The second islandable microgrid is configured with a generator 152, an IED 170 configured to monitor generator 152, CT 123, PT 122, circuit breakers 140, 142, 144, loads 146, 148, and IEDs 172, 174. Each IED 170, 172, 174 may be configured similar to the IEDs 160, 162, 164 of the first microgrid 190 to obtain electric power system measurements, calculate electric power system operating conditions, apply protection algorithms, trip circuit breakers, and communicate with the master controller 180.

The first islandable microgrid 190 may be in electrical communication with the second islandable microgrid 192 using, for example, a transmission line, a feeder line, a common bus, or the like. The first islandable microgrid 190 and second islandable microgrid 192 may be connectable and/or separable using, for example one or more circuit breakers, switches, reclosers, or the like. When the microgrids are electrically separated, they are in an islanded condition. When connected, the first islandable microgrid 190 and the second islandable microgrid 192 may operate as a single electrical system. In various embodiments, the first islandable microgrid 190 and the second islandable microgrid 192 may represent systems that may be temporarily combined. For example, each microgrid may be operated by a military unit. The systems may be connected when the two units are deployed at the same location and separated if the units are separated.

In various embodiments, the master controller 180 may be in communication with several islandable microgrids, although only two are illustrated. Furthermore, the master controller 180 may be in communication with further master controllers 182, 184, each of which may be in communication with other sets of islandable microgrids. All of the microgrids in communication with each of the master controllers 180, 182, 184 may be electrically connected, or various parts thereof may be electrically islanded. In various embodiments, the master controller may be embodied as the SEL-3530 controller available from Schweitzer Engineering Laboratories, Inc., of Pullman, Wash.

Master controller 180 may be in communication with a communication security gateway 186 which may include a communication firewall for security uses. The communication security gateway 186 may facilitate communication between the master controller 180 and a Human Machine Interface (HMI) 188 configured to interface for the master controller 180. Other master controllers 182, 184 may also be in communication with the HMI 188 via the communication security gateway 186 or other communication security gateways. Further master controllers 182, 184 may include separate HMIs, which may be in communication therewith using communication security gateways.

In one embodiment, the communication security gateway may communicate using a serial network communication protocol. In other embodiments, IEDs may communicate with the master controller using a variety of technologies, such as Ethernet, serial, USB, SONET, and similar protocols. Exclusive use of serial communication between the IEDs and the master controllers may simplify the configuration of the system.

As has been described above, certain embodiments herein may be used to determine an islanding status of portions of the electric power delivery system. IEDs such as IEDs 160, 162, 164, 170, 172, 174 may be similarly configured to determine electric power system operating conditions from measurements therefrom, and report such operating conditions (including transient excursions thereof from the predetermined operating parameters) to the master controller 180. For example, the IEDs may be configured to determine an electric power system frequency, determine whether the electric power system frequency is outside of predetermined operating parameters, and report any excursion outside of the predetermined operating parameters to the master controller 180, even if the excursion is temporary.

The master controller 180 may be configured to test for islanding by commanding an IED to cause a transient disturbance into the electric power delivery system. The transient disturbance may be caused in a variety of ways. For example, a command may be issued to modify the governor control circuits of the generators in a system. These small modifications alter the frequency of the system. Each node may set a frequency threshold that is crossed due to the changes to the modifications of the governor control circuits. Controllers may correlate time-stamped under-frequency ("UF") and over-frequency ("OF") signals at various nodes in the system to determine the system's topography. In other embodiments, the disturbance may correspond to events in the power system that impact electrical parameters across the system. For example, such events may include connection/disconnection of loads, tap changes of a voltage transformer, etc. When an event occurs, a time-stamp associated with the event may be recorded. The time-stamp of the event may be used to compare time-aligned measurements from different nodes to determine whether the event resulted in a detectable change in the electrical parameters at the node.

Each IED detecting a disturbance or event may report the detection to the master controller 180. Based on which IEDs reported the transient disturbance, the master IED 180 may identify nodes that are electrically connected and nodes that are islanded.

In one particular example, the master controller 180 may command IED 170 to inject a disturbance into the governor of generator 152. The disturbance may be intended to cause a transient frequency deviation on the electric power delivery system. Each IED 172, 174, 160, 162, 164 that detected the transient frequency deviation would then report such to the master controller 180. If each of the IEDs detected and reported the deviation, master controller 180 may determine that the power systems monitored thereby are electrically connected.

If, however, IEDs 160, 162, and 164 did not detect the frequency deviation, then master controller 180 may be configured to determine that the first islandable microgrid 190 is islanded from the second islandable microgrid 192. When an island is detected, the master controller 180 may be configured to verify the detection by causing a transient in the islanded portion. For example, once the master controller 180 determines that the first islandable microgrid 190 is islanded, the master controller 180 may cause IED 160 to inject a disturbance into generator 150 to cause a transient frequency deviation. If IEDs 170, 172, and 174 do not report detection of the disturbance, then the master controller 180 may verify the islanded condition.

IEDs 160, 162, 164, 170, 172, 174 may be configurable to accept load shedding priority information. In some embodiments, master controller 180 may be configured to determine that a load and/or generator should be disconnected from the electric power delivery system. In such a determination, master controller 180 may be configured to shed lower priority loads and/or generation first. Each IED may be configured to communicate its shedding priority to the master controller 180 for such determinations.

Master controller 180 may further be configured to shed generation in response to various conditions. In certain embodiments, the least efficient generator may be shed first when the power provided the remaining generators is sufficient to satisfy the load. For example, if one generator is less efficient, or uses more fuel than other generators, the master controller 180 may be configured to shed that generator if the system is not islanded and the remaining generators can produce sufficient electrical power to supply the attached loads.

Figure 2:
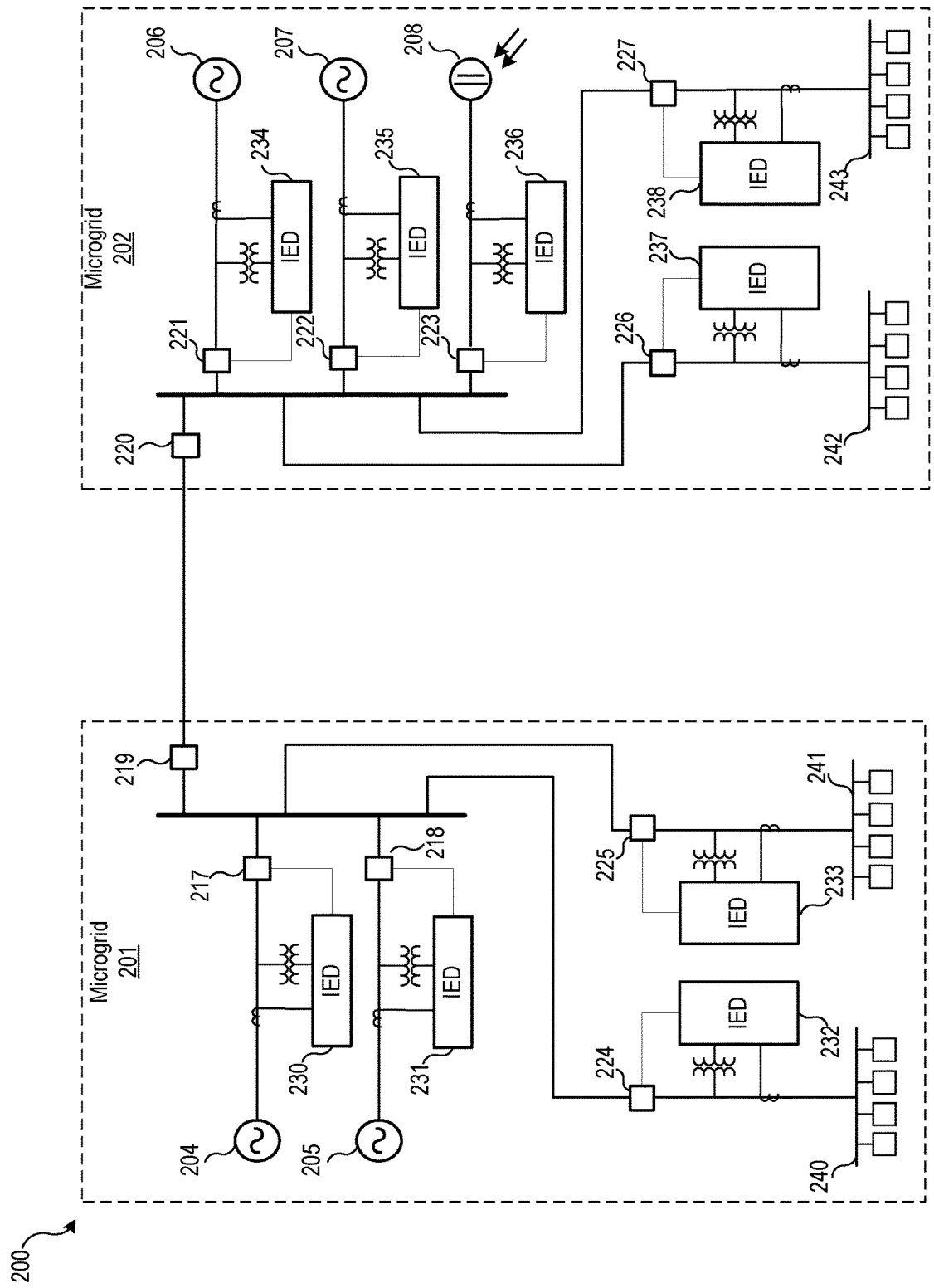
FIG. 2 illustrates a simplified one-line diagram of two microgrids that may operate in either an electrically connected or separated configuration consistent with the embodiments of the present disclosure.

FIG. 2 illustrates a simplified one-line diagram of two microgrids that may operate in either an electrically connected or separated configuration consistent with the embodiments of the present disclosure. Microgrids 201 and 202 may be electrically connected by selectively closing breakers 219 and 220.

System 200 includes a plurality of IEDs 230-238 configured to monitor and control various components of system 200 and to cooperate operation among the devices. A communication network (not shown) may enable communication among IEDs 230-238. Such communication may enable, among other things, synchronizing microgrids 201 and 202 before the two microgrids are connected, balancing electrical generation and load, etc. In some embodiments, communication among IEDs 230-238 may be enabled using serial communications in a daisy chain configuration.

In microgrid 201, IEDs 230 and 231 may be configured to monitor and control generators 204 and 205, respectively, and IEDs 232 and 233 may be configured to monitor and control electrical energy supplied to loads 224 and 225, respectively. IEDs 232 and 233 may be configured to selectively actuate breakers 217 and 218, respectively, to electrically connect or disconnect generators 204 and 205, respectively, from microgrid 201. Similarly, IEDs 232 and 233 may be configured to selectively actuate breakers 224 and 225, respectively, to electrically connect or disconnect loads 240 and 241, respectively, from microgrid 201. In various embodiments, one or more of IEDs 230-238 may be embodied using the SEL-849 relay available from Schweitzer Engineering Laboratories, Inc., of Pullman, Wash.

In microgrid 202, IEDs 234 and 235 may be configured to monitor and control generators 206 and 207, respectively. IED 236 may be configured to control the connection of photovoltaic cell 208 to microgrid 202. In various embodiments a variety of power generation devices may be connected to microgrid 202, such as inverter-based battery systems, wind turbines, etc. IEDs 234, 235, and 236 may be configured to selectively actuate breakers 221, 222, and 223, to electrically connect and disconnect generator 206, generator 207, and photovoltaic cell 208, respectively, from microgrid 202. Similarly, IEDs 237 and 238 may be configured to selectively actuate breakers 226 and 227, respectively, to electrically connect or disconnect loads 242 and 243 from microgrid 202.

IEDs 230-238 may be configured to create a time-stamped electrical disturbance in system 200. IEDs 230-238 may monitor the system for the injected disturbance. The data may be used to determine the islanded state of both microgrids. In addition to monitoring for injected disturbances, 230-238 may be configured to monitor the rate of change of the system frequency to balance electrical generation and electrical load.

In various embodiments, IEDs 230-238 may be interchangeable to facilitate the configuration of system 200. Any of the IEDs comprised in microgrid 201 or microgrid 202 may be designated as the primary controller of system 200. The primary controller may coordinate operation of system 200 as a whole, while each IED continues to monitor a specified piece of equipment (e.g., a generator or load). In one embodiment, each IED may be configured to determine whether it is associated with a generator or a load or is operating as a central controller. Additional configurations may be implemented through a push-button user interface on the IED itself. This avoids the complexity of logging into the IED to configure it for usage.

In one specific embodiment, an IED configured to act as a primary controller may be designated using a plurality of dip switches. In one embodiment, each IED may be configured as either a primary or a secondary device using a dip switch. Such a configuration may allow for rapid connection of microgrids with minimal configuration. In other embodiments, alternative strategies may be employed to determine the primary controller and/or to configure control of system 200. Further, alternative selection mechanisms may be utilized, such as rotary switches, configuration settings, software configurations, and the like. During the connection of microgrids 201 and 202, an IED designated as the primary controller may gather information regarding the microgrids 201 and 202 and signal to the grids to synchronize their operating voltage, frequency, and phase angle in order to reduce the risk of damage to both systems.

Generators 204-207 may supply power to the embodiment illustrated in FIG. 2. However, microgrids consistent with the embodiments in the present disclosure may also receive power from renewable resources such as wind and solar energy. Photovoltaic cell 208 is supplying microgrid 202 with solar energy. Solar energy produces a direct current output that must be converted to an alternating current with the same phase and frequency of the alternating current produced by the generators 206 and 207.

Figure 3:
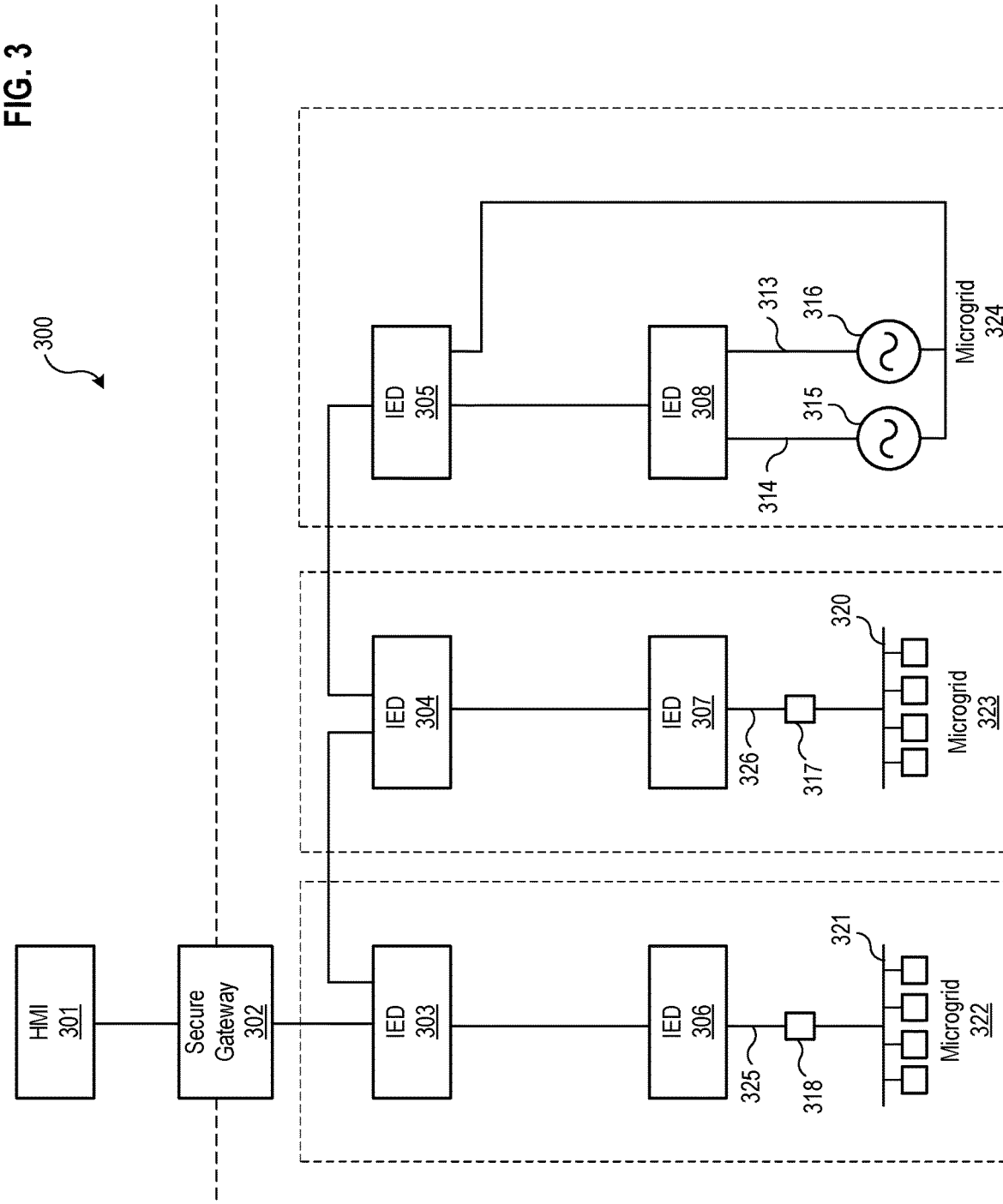
FIG. 3 illustrates a simplified one-line diagram of the connections and communications between microgrid controllers consistent with the embodiments of the present disclosure.

FIG. 3 illustrates a simplified one-line diagram of the connections and communications between a plurality of microgrids consistent with the embodiments of the present disclosure. For simplicity, the illustration shows only two electrical loads. The system consistent with the embodiments in the present disclosure may support up to 192 IEDs, each of which may be configured to monitor and control either power generators or electrical loads. These IEDs may be daisy-chained together through an Ethernet network, wherein the IEDs auto-negotiate the master controller. IEDs in the system may be distinguished as load controllers or generator controllers through external stickers that identify their function and use.

IEDs 306 and 307 may be configured to monitor the frequency and voltage supplied to loads 321 and 320, respectively. Standard automatic generator control (AGC) schemes may be used to control the frequency and voltage of the generators, and further improvements to power generation may be implemented through a monitoring algorithm, wherein system IEDs identify the units that are running less efficiently and shut them off under load conditions that other generators in the system can tolerate. Load shedding may be enabled directly on the IEDs monitoring the loads, potentially allowing users to keep critical loads attached to the grid and allowing for low-priority loads to be shed first by engaging electrical interrupters 317 and 318. Interrupters 317 and 318 may be MCCBs that require human intervention to close to minimize coordination complexities within the system.

Consistent with the embodiments in the present disclosure, IEDs 303, 304, and 305 may be linked together through an Ethernet network. Represented in the illustration, IEDs 303, 304, and 305 are each a central controller of microgrids 322, 323, and 324. IEDs 303, 304, and 305 may then be connected to secondary IEDs, such as IED 306, 307, and 308, through a variety of communication protocols and media including point-to-point serial connection over fiber optic cables, copper wiring, and/or encrypted radio. As illustrated in connection with microgrid 324, redundant connections may be provided. For example, generators 315 and 316 may be connected to both IED 308 and IED 305. IEDs 303, 304, and 305 may meter and control power consumption and production. IEDs 306, 307, and 308 may provide a variety of other functions, including but not limited to, load shedding, generator control, emergency notification, voltage and frequency measuring, and collecting information about status condition of the system. In various embodiments, communication among the components of system 300 may be implemented using the Modbus protocol to read information including but not limited to fuel flow, valve positioning, and general machine information about generators 315 and 316.

Consistent with embodiments in the present disclosure, secure network gateway 302 may provide a network interface to allow only select external connections to the grid system. Secure network gateway 302 may serve as a connection between the microgrids 322, 323, and 324 and a Human/Machine Interface (HMI) 301. HMI 301 may connect to third party appliances such as PCs, tablets, and notebooks through a variety of protocols to present system information such as, but not limited to, flowrates, machine efficiency utilizations, operational statistics, and grid topology.

Figure 4:
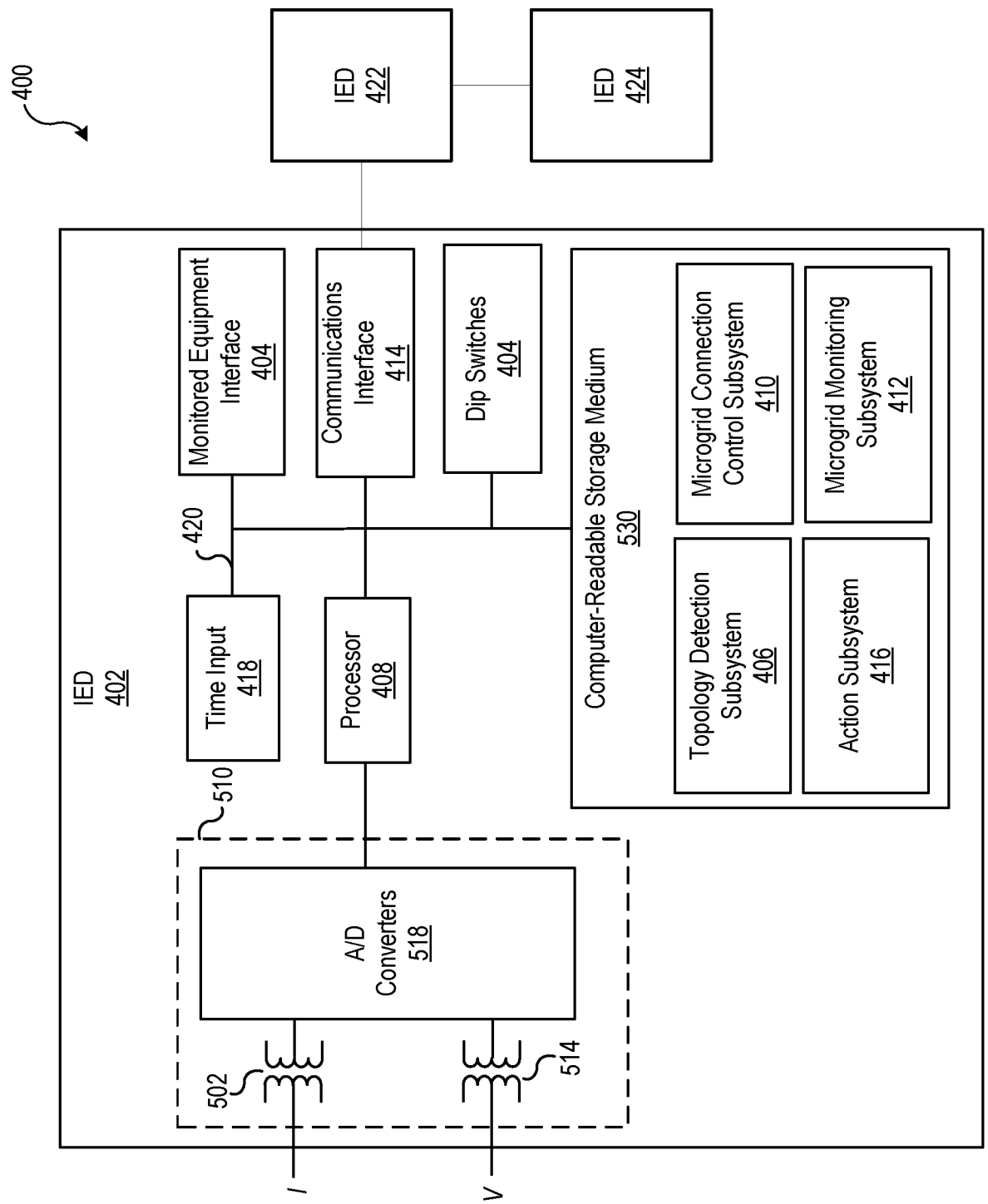
FIG. 4 illustrates a functional block diagram of a microgrid controller configured to determine the topology of a microgrid consistent with the embodiments of the present disclosure.

FIG. 4 illustrates a functional block diagram of an IED 402 consistent with the embodiments of the present disclosure. IED 402 may be implemented using hardware, software, firmware, and/or any combination thereof. Moreover, certain components or functions described herein may be associated with other devices or performed by other devices. The specifically illustrated configuration is merely representative of one embodiment consistent with the present disclosure.

IED 402 includes a communications interface 414 configured to communicate with other IEDs and/or system devices. In certain embodiments, the communications interface 414 may facilitate direct communication with another IED or communicate with another IED over a communications network. Communications interface 414 may facilitate communications with multiple IEDs. IED 402 may further include a time input 418, which may be used to receive a time signal (e.g., a common time reference) allowing IED 402 to apply a time-stamp to the acquired samples. In certain embodiments, a common time reference may be received via communications interface 414, and accordingly, a separate time input may not be required for time-stamping and/or synchronization operations. One such embodiment may employ the IEEE 1588 protocol. A monitored equipment interface 404 may be configured to receive status information from, and issue control instructions to, a piece of monitored equipment (such as a circuit breaker, a generator, transformer, or the like).

In some embodiments a plurality of dip switches 404 may be utilized to configure IED 402. In various embodiments, the dip switches may be utilized to specify whether IED 402 functions as a primary or a secondary IED in the interconnected microgrid system. Further, the dip switches 404 may be utilized to specify a particular type of equipment (e.g., a generator or a load) monitored by IED 402.

One of the functions of IED 402 may be to detect the electrical topology of the interconnected microgrid system to determine which loads and DERs are in electrical communication. In various embodiments, the topology may be detected by injecting electrical disturbances into the system by varying the control parameters of the governors of electrical generators in the system. In some embodiments, IEDs associated with various nodes may establish frequency thresholds that are crossed due to the changes to the modifications of the governor control circuits. Controllers may correlate time-stamped under-frequency ("UF") and over-frequency ("OF") signals at various nodes in the system to determine the system's topography. In other embodiments, current thresholds may be utilized, and controllers may compare current measurements to changes in the current measured at various electrical nodes in a system.

Injection of periodic disturbances may allow for detection of islanded subsystems during periods of steady-state system operation. In other embodiments, a variety of other types of events in the microgrid system may be analyzed to identify electrically connected nodes. For example, changes in voltage or frequency may be analyzed following the connection or disconnection of a load to identify electrically connected nodes. From this information, IED 402 may be configured to detect the topology of the microgrid system and determine if any subsections of the grid are islanded. The microgrid topology detection may be triggered by events or may be performed at specific time intervals. Certain embodiments may determine topology based on both the occurrence of certain events and according to a schedule.

IED 402 may also be configured to facilitate connection of disparate microgrids. The microgrid connection control subsystem 410 may be configured to monitor the frequency, phase, and voltage of the connecting microgrids and to send signals to synchronize the previously listed parameters to minimize the potential for system damage and electrical disruption. Microgrid connection control subsystem 410 may be connected to multifunction IEDs that can be configured to monitor relevant system parameters that may need to be synchronized prior to grid connections. Microgrid connection control subsystem 410 may also receive input from other systems such as communication interface 414 and processor 408 to determine the hierarchy of the connected controllers. Processor 408 may receive input from dip switches 404 or through connections from other IEDs 422 and 424 connected to the communication interface 414 to determine the master controller of the grid system.

The microgrid monitoring system 412 may function to monitor the health of the microgrid. The monitoring system may connect to IEDs 422 and 424 to gather system information by measuring fuel flow rates, machine efficiency utilizations, operational statistics, valve positioning, and other miscellaneous information pertaining to the operation of the microgird. IEDs 402, 422, and 424 may also periodically inject electrical disturbances into an associated microgrid and subsequently monitor the different nodes of the microgrid for the propagation of the disturbance to detect if certain aspects of the system are islanded.

Action subsystem 416 may be configured to communicate with microgrid monitoring subsystem 412 to try and determine if there are any issues in the microgrid system, such as an electrical fault or an unsynchronized generator. If an abnormality is detected, action subsystem 416 may then take steps to mitigate the potential damage and danger, such as activating an electrical interrupter or deactivating a generator. Action subsystem 416 may also monitor load energy consumption and determine if protective action, such as load shedding, should be taken. Action subsystem 416 may also shut off generators running below a certain efficiency threshold under load conditions the system can tolerate. In addition to implementing protective actions, action subsystem 416 may also implement a variety of control actions based on information relating to the electrical conditions in the microgrid.

A processor 408 may be configured to receive and process information from a microgrid monitoring system 412, as well as communications interface 414, topology detection subsystem 406, and microgrid connection control subsystem 410. Processor 408 may operate using a variety of processing speeds and architectures, and may be programmed to perform a variety of calculations, processes, and algorithms. Processor 408 may be configured to perform various algorithms and calculations described herein. Processor 408 may be embodied as a general integrated circuit, an application specific integrated circuit, a field-programmable gate array (FPGA), and/or any other suitable programmable device.

Consistent with the embodiments in the present disclosure, communication interface 414 may receive information utilized by topology detection subsystem 406, processor 408, microgrid connection control subsystem 410, microgrid monitoring subsystem 412, action subsystem 416, and IEDs 422 and 424. This information may then be communicated to a human system operator over a variety of different protocols to potentially increase the ease of accessibility for system operators. Communication interface 414 may also communicate with IEDs 422 and 424 as either the master controller providing instructions to secondary controllers, or as a secondary controller taking instructions from a master controller. A control hierarchy may be determined using dip switches 404.

Figure 5:
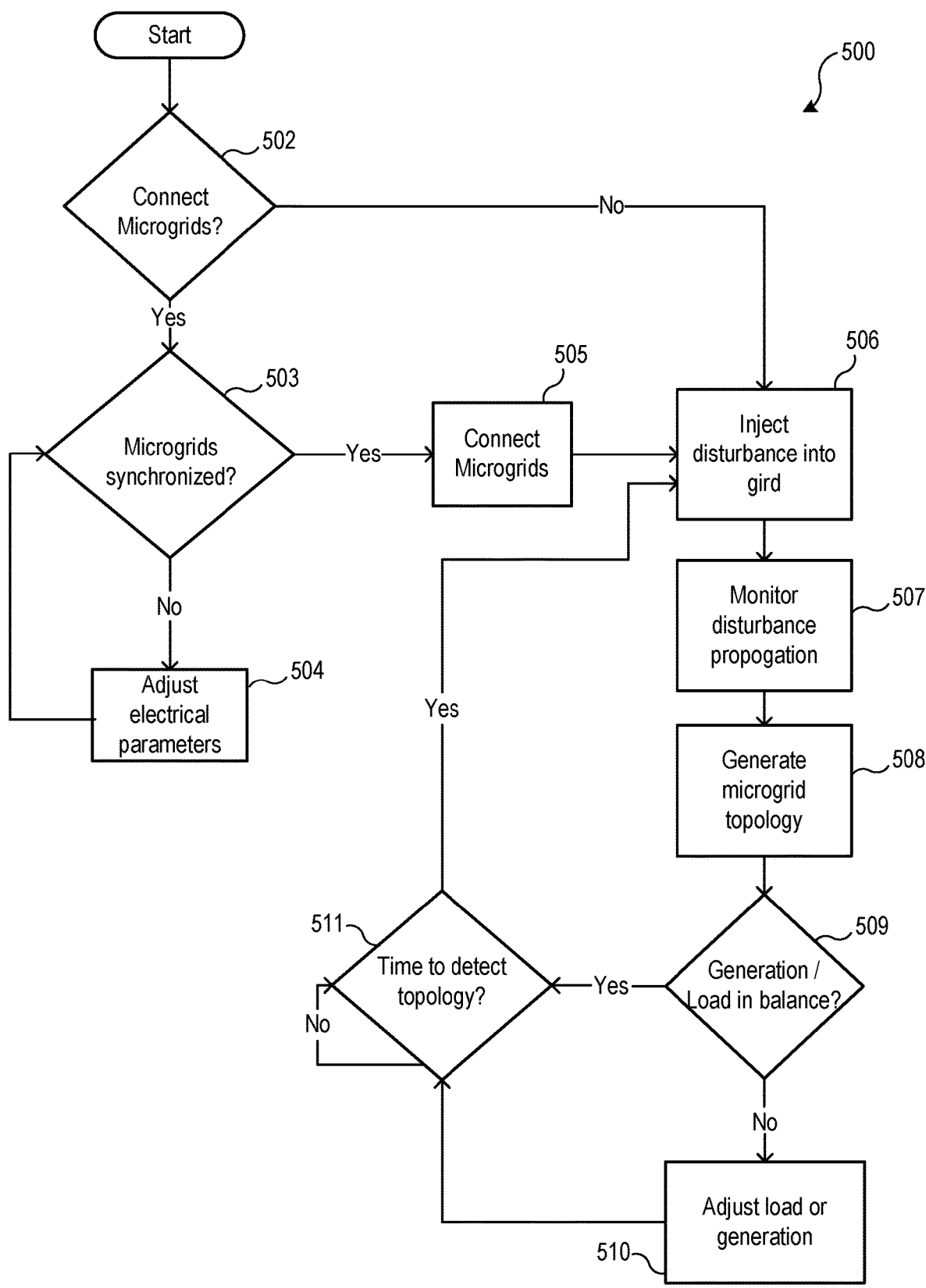
FIG. 5 illustrates a flow chart of a method for linking microgrids and determining the topology of a microgrid consistent with the embodiments in the present disclosure.

FIG. 5 illustrates flow chart method 500 of connecting, monitoring, and determining the topology of a microgrid. In various embodiments, method 500 may be implemented by a control system configured to receive signals from a system to monitor and control microgrids. At 502, method 500 may determine if two islanded microgrids are to be connected. If there are microgrids being connected, at 503 method 500 determines if microgrids are synchronized. If the microgrids are synchronized, at 505, the microgrids are connected. If the microgrids are not syncynronized, at 504 method 500 may adjust the electrical parameters at 504. Method 500 may then subsequently return to 503 to determine if the microgrids are synchronized. The cycle between 503 and 504 may repeat until the microgrids are synchronized.

Once the microgrids are synchronized and connected, at 506, method 500 may inject an electrical disturbance into the grid system generators. The subsequent propagation of the disturbance may then be monitored at 507. From step 507, the topology of the microgrid may then be determined at 508 by detecting the nodes affected by the injected disturbance.

At 509, method 500 may determine if the generation capacity is balanced with the load requirements. If not, adjustments may be made to the load or generation associated with the system. In some embodiments, load and/or shedding may be based on under-frequency and over-frequency thresholds. If the generation capacity and load requirements are balanced, method 500 may progress to 511.

At 511 method 500 may wait until it is time to perform another check of the system's topology. In some embodiments, a schedule may be utilized to determine when a check of the topology should be performed. In other embodiments, a check may be performed in response to specified conditions.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A control system for an electric power system, the control system comprising:
    a plurality of intelligent electronic devices configured to monitor a respective portion of the electric power system, and configured to:
        obtain electric power system measurements from the respective portion of the electric power system;
        determine electric power system operating conditions from the electric power system measurements; and
        transmit the electric power system operating conditions;
    a master controller configured to communicate with the plurality of intelligent electronic devices, the master controller comprising:
        a communications interface configured to receive the electric power system operating conditions from the plurality of intelligent electronic devices;
        a topology detection subsystem configured to determine an electrical island within the electric power system based on a plurality of time-stamped under-frequency and over-frequency signals detected by the plurality of intelligent electronic devices at a plurality of nodes within the electrical island; and
        an action subsystem configured to implement an action based on the topology of the electric power system;
    wherein an under-frequency and over-frequency condition is injected into the electric power system by the master controller by communicating commands to a subset of the plurality of intelligent electronic devices.

2. The control system of claim 1, wherein the electric power system comprises a plurality of islandable microgrids, each of the plurality of microgrids comprising at least one distributed energy resource (DER) and one electrical load.

3. The system of claim 2, wherein the DER comprises one of a generator and engine set, a battery, a wind turbine, and a photovoltaic array.

4. The control system of claim 1, wherein the commands comprise modifying a setting of a distributed energy resource.

5. The control system of claim 1, wherein the commands comprise modifying a governor setting of an electrical generator.

6. The control system of claim 1, wherein the plurality of intelligent electronic devices is configured to transmit the electric power system operating conditions, and the master controller is configured to receive the electric power system operating conditions using a serial communication protocol.

7. The control system of claim 1, wherein a subset of the plurality of intelligent electronic devices comprises a user interface configured to receive an indication of a priority of an associated load, and the subset of the plurality of intelligent electronic devices is configured to communicate the indication of priority of the associated load to the master controller.

8. The control system of claim 7, wherein the master controller is configured to shed one or more associated loads based on the indication of priority.

9. The control system of claim 1, wherein the master controller is further configured to determine an efficiency of a plurality of generators in the electric power system and to identify a generator to shed based on the determined efficiency of generators.

10. The control system of claim 1, wherein the master controller is in communication with a human-machine interface via a communication security gateway.

11. The control system of claim 1, wherein the master controller is further configured to communicate with a plurality of secondary controllers, each of the secondary controllers further configured to communicate with an associated plurality of intelligent electronic devices.

12. The control system of claim 11, wherein the master controller and each of the plurality of secondary controllers comprises a plurality of dip switches, and wherein an arrangement of the plurality of dip switches differentiate the master controller from the secondary controllers.

13. The system of claim 1, wherein the action comprises one of a protection action and a control action.

14. A method for controlling an electric power system, the method comprising:
    providing a plurality of intelligent electronic devices, each of the plurality of intelligent electric devices:
        monitoring a respective portion of the electric power system;
        obtaining electric power system measurements from the respective power of the electric power system;
        determining electric power system operating conditions from the electric power system measurements;
        transmitting the electric power system operating conditions;
    providing a master controller, the master controller:
        communicating with the plurality of intelligent electronic devices;
        receiving the electric power system operating conditions from the plurality of intelligent electronic devices;
        injecting an under-frequency and over-frequency condition into the electric power system by communicating commands to a subset of the plurality of intelligent electronic devices;
        determining an electrical island within the electric power system based on a plurality of time-stamped under-frequency and over-frequency signals detected by the plurality of intelligent electronic devices at a plurality of nodes within the electrical island; and
        implementing an action based on the topology of the electric power system.

15. The method of claim 14, wherein-injecting the under-frequency and over-frequency condition comprises modifying a setting of a plurality of at least one distributed energy resource (DER) in the electric power system.

16. The method of claim 14, wherein the commands comprise modifying a governor setting of an electrical generator.

17. The method of claim 14, further comprising:
    receiving an indication of a priority of an associated load via a user interface of a subset of the plurality of intelligent electronic devices;

communicating the indication of the priority to the master controller.

18. The method of claim 17, further comprising the master controller shedding one or more associated loads based on the indication of priority.

19. The method of claim 14, further comprising the master controller determining an efficiency of a plurality of generators in the electric power system and shedding a generator based on the determined efficiency of the plurality of generators.

20. The method of claim 14, further comprising providing a plurality of secondary controllers, each of the secondary controllers in communication with an associated plurality of intelligent electronic devices.

21. The method of claim 20, further comprising arranging a plurality of dip switches on the master controller and the secondary controllers to differentiate the master controller from the secondary controllers.

* * * * *